United States Patent [19]
Kikuchi et al.

[11] Patent Number: 5,894,882
[45] Date of Patent: Apr. 20, 1999

[54] HEAT SINK STRUCTURE FOR COOLING A SUBSTRATE AND AN ELECTRONIC APPARATUS HAVING SUCH A HEAT SINK STRUCTURE

[75] Inventors: Shunichi Kikuchi; Minoru Hirano; Kiyotaka Seyama; Hideaki Yoshimura; Takashi Kanda; Hitoshi Nori, all of Kawasaki, Japan

[73] Assignee: Fujitsu Limited, Kawasaki, Japan

[21] Appl. No.: 08/650,029

[22] Filed: May 17, 1996

Related U.S. Application Data

[63] Continuation of application No. 08/123,083, Sep. 20, 1993, abandoned.

[30] Foreign Application Priority Data

Feb. 19, 1993 [JP] Japan ................................. 5-030901

[51] Int. Cl.$^6$ .................................. F28F 7/00; H01L 23/46
[52] U.S. Cl. ..................... 165/80.3; 165/185; 174/16.3; 257/722; 361/690; 361/703; 361/704
[58] Field of Search ............................ 165/80.3, 185; 174/16.3; 257/713, 722; 361/690, 697, 703, 704

[56] References Cited

U.S. PATENT DOCUMENTS

| | | | |
|---|---|---|---|
| 4,620,216 | 10/1986 | Horvath | 257/722 X |
| 4,926,935 | 5/1990 | Haushalter | 165/185 |
| 5,195,576 | 3/1993 | Hatada et al. | 165/80.3 |

OTHER PUBLICATIONS

Author Unknown, "Heat Sink Fabrication Method", IBM TDB, vol. 2, No. 10A, Mar. 1985, pp. 5656–5657.
R.G. Biskeborn et al., "Cooling Fin Structure", IBM Tech. Disc. Bull, vol. 25, No. 2, Jul. 1982, p. 618.
*Patent Abstracts of Japan*, vol. 6, No. 218 (E–139)[1096], Nov. 2, 1982 & JP-A-57 122551 (Sumitomo), Jul. 30, 1982.
*IBM Technical Disclosure Bulletin*, vol. 26, No. 7A, Dec. 1983, Horvath et al., "Metal Cooling Fins for a Semiconductor Package," pp. 3233–3234.
*IBM Technical Disclosure Bulletin*, vol. 32, No. 9B, Feb. 1990, "Heat Transfer Structure for Semirigidly Mounted, Solder Ball–Connected, IC Chip," pp. 408–409.

*Primary Examiner*—Leonard R. Leo
*Attorney, Agent, or Firm*—Staas & Hasley

[57] ABSTRACT

A heat sink structure of a module substrate includes a plurality of stripe-like bottom regions extending in a longitudinal direction and repeated in a lateral direction with a predetermined pitch, a plurality of stripe-like top regions extending in said longitudinal direction and repeated in the lateral direction with said predetermined pitch, such that the stripe-like bottom regions and the stripe-like top regions are repeated alternately in the lateral direction, wherein the stripe-like top regions and the stripe-like bottom regions have respective lateral edges that are connected with each other by cooling fins.

17 Claims, 18 Drawing Sheets

$R = R_a + R_b$

FIG. 9 (A)
FIG. 9 (B)
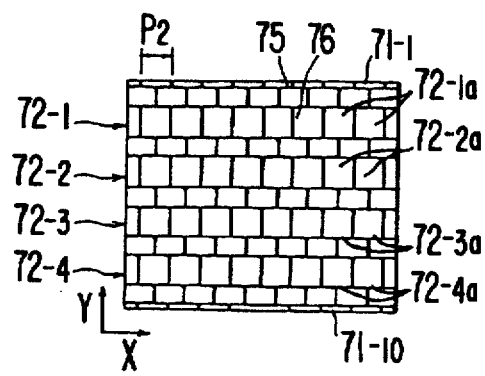
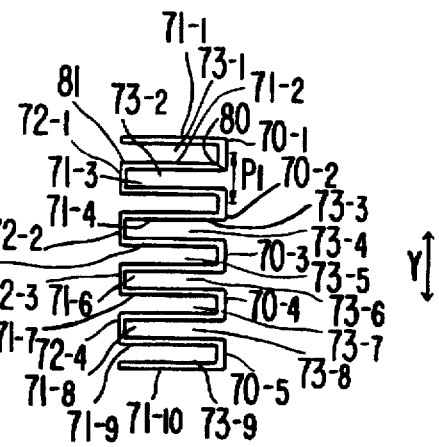
FIG. 9 (C)
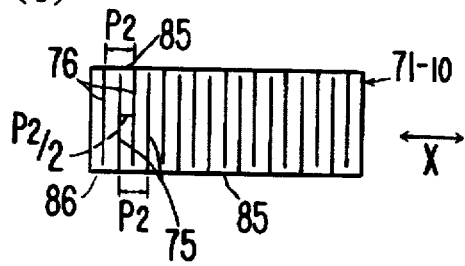
FIG. 9 (D)
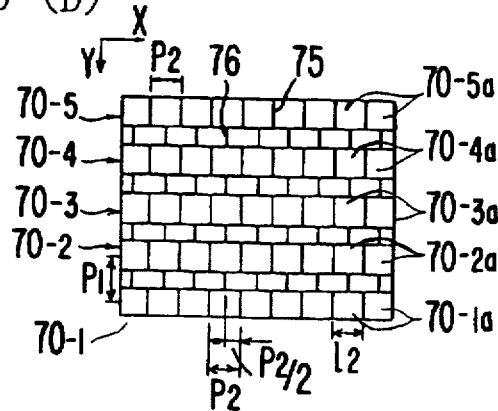

$$S_3 + S_4 + S_5 + S_6 = S_B > S_A$$

HEAT SINK STRUCTURE FOR COOLING A SUBSTRATE AND AN ELECTRONIC APPARATUS HAVING SUCH A HEAT SINK STRUCTURE

This application is a continuation of application Ser. No. 08/123,083, filed Sep. 20, 1993, now abandoned.

BACKGROUND OF THE INVENTION

The present invention generally relates to electronic apparatuses and more particularly to a heat sink structure adapted for mounting on a substrate of an electronic apparatus for cooling the same.

With recent developments in high speed computers and other electronic processing apparatuses, there is a demand for increasing the mounting density of module substrates that are used for carrying a circuit module. However, such an increased mounting density has led to a problem of increased heat generation. Therefore, there is an acute demand for a more efficient heat sink structure characterized by a reduced thermal resistance for heat dissipation, for module substrates.

Generally, heat sinks of module substrates have a size corresponding to the size of the module substrate itself and may have a size as large as 70 mm for each edge. Such a heat sink having a large size and designed for mounting directly upon the module substrate, is required to have a small rigidity such that the difference in the thermal expansion between the heat sink and the substrate is effectively absorbed. In recent electronic apparatuses, as a result of the increased mounting density of the substrates or mother boards within the electronic apparatuses, there is a tendency that the substrates are disposed relatively to each other with a decreased separation.

When air cooling an electronic apparatus having such a structure by air, it is preferable to apply the cooling air so as to flow generally parallel to the substrates rather than applying the cooling air perpendicularly to the substrate. Thereby, one can simplify the construction of the apparatus and reduce the space needed for cooling.

Therefore, it has been desired to provide a heat sink that is: (1) applicable to the cooling system wherein the cooling air flows parallel to the circuit substrate; (2) characterized by a small thermal resistance; and (3) characterized by a small rigidity.

FIGS. 1(A) and 1(B) show an example of a conventional heat sink 10 that is disclosed in the Japanese Laid-open Patent Publication 59-202657.

Referring to the drawings, the heat sink 10 includes a number of cooling fin elements 11 connected with each other in X- and Y-directions by a base 12 to form a matrix, wherein each fin element 11 has a top surface formed with a hole 13.

Each of the cooling fin elements 11 is formed with a cutout 14 that penetrates into the element 11 in the X-direction and another cutout 15 that penetrates into the element 11 in the Y-direction. Further, there is formed a gap between adjacent cooling fin elements 11 wherein, in correspondence to the gap, there are formed grooves 16 and 17 such that the groove 16 extends in the X-direction parallel to the cutout 14 and the groove 17 extends in the Y-direction parallel to the cutout 15. The heat sink 10 is mounted on a module substrate by soldering the base 12 thereon.

The heat sink 10 of FIGS. 1(A) and 1(B) is cooled by applying a flow, or jet, cooling air 20 vertically from the upward direction. Thus, the construction of FIG. 1 requires a duct structure immediately above the heat sink 10 for directing the cooling air, such a duct structure increases the size, particularly the height of the apparatus. Therefore, the construction of FIGS. 1(A) and 1(B) has an obvious drawback in that one cannot increase the mounting density of the substrate boards within an electronic apparatus.

FIG. 2 shows another heat sink 30 disclosed in the Japanese Laid-open Patent Publication 56-122149.

Referring to FIG. 2, the heat sink 30 includes a heat conduction base 31, and a plurality of fins 32 are provided vertically on the base 31 with a separation from each other. Each fin 32 is formed with a number of slits 33 with a separation from each other in the X-direction by a predetermined interval, wherein the slits are formed to extend in the Y-direction over the entire length of the heat conduction base 31. Further, a passage 34 of cooling air is formed between the adjacent fins 32. The heat sink 30 is mounted upon the module substrate by soldering the heat conduction base 31.

In the case of the heat sink 30 of FIG. 2, a cooling air flow 50 is applied in the X-direction parallel to the module substrate (of which illustration is omitted in the drawing). As a result of such a construction, one can eliminate the duct structure to direct the air. Thus, the construction of FIG. 2 is suitable for increasing the mounting density of the module substrates within the electronic apparatus.

On the other hand, the construction of FIG. 2 still has a drawback in that one cannot satisfactorily reduce the thermal resistance R between the heat sink and the air. Generally, the thermal resistance R of a heat sink for dissipating the heat of a module substrate to the air is represented as $$R = t/(\lambda \cdot A) + 1/(h \cdot A_f) \qquad (1)$$

wherein $\lambda$ represents the thermal conductivity of the heat sink, A represents the area of the heat conduction base of the heat sink, t represents the thickness of the heat conduction base, h represents the heat transfer coefficient on the fin surface for dissipating heat to the air, and $A_f$ represents the surface area of the fin that is contacted by the cooling air.

FIG. 3 shows the heat dissipation caused by a heat sink 40 schematically.

It will be noted that the heat sink 40, includes a fin part 41 for dissipating heat to the air and a heat conduction base 43 for conducting the heat from a module substrate 42 to the fin 41. As indicated by an arrow 45, the heat generated at the module substrate 42 is conducted to the fin 41 via the heat conduction base 43 and the heat is transferred to the air from the fin 41 as indicated by an arrow 46.

In the foregoing Eq.(1), the first term, $t/(\lambda \cdot A)$, represents the thermal resistance Ra that is encountered when conducting the heat of the module substrate 42 to the fin 41 via the heat conduction base 43. On the other hand, the second term $1/(h \cdot A_f)$ represents the thermal resistance Rb that is encountered when dissipating heat as in FIG. 3 from the fin 41 to the air.

Returning to FIG. 2 again, it will be noted that the passage 34 of the air has a U-shaped cross section characterized by an open top 35. Thus, the passage 34 communicates to the part above the heat sink 30 where the resistance to the air flow is minimum. On the other hand, the cooling air that has entered into the passage 34 experiences a resistance caused by the friction at the surface of the fin 32, and the speed of the air decreases gradually due to the pressure loss occurring in the passage 34. Thus, when the heat sink 30 is formed to have a size of more than 70 mm in the X-direction, the cooling air cannot pass the full length of the passage 34 and, instead, escapes in the upward direction as indicated by an arrow 51. Thus, the part of the heat sink 30 that is located downstream of the point where the escape of the cooling air occurs, is no longer effectively cooled by the air flow, and the efficiency of cooling is degraded significantly.

FIG. 4 explains the foregoing phenomenon.

Referring to FIG. 4, it will be noted that the area of a fin 32 that is cooled by the air is designated as $S_1$ and $S_2$, while $S_3$ and $S_4$ represent the total area of the fins 32. As will be noted, the area $S_1$ or $S_2$ that is actually cooled by the air is substantially smaller than the total area $S_3$ or $S_4$. In a typical example, the proportion of the area $S_1$ or $S_2$ with respect to the area $S_3$ or $S_4$ is about 60%. This indicates that the effective area $A_f$ of Eq.(1) is about 60% of the actual surface area of the fin. Thus, it has been difficult to reduce the thermal resistance R in the conventional heat sink structure.

The heat sink structure 30 of FIG. 2 has another drawback in that the structure cannot absorb the thermal deformation caused particularly in the Y-direction. It should be noted that the heat sink structure 30 has a reduced rigidity with respect to the deformation in the X-direction due to the formation of the number of slits 33. As a result, the thermal stress between the heat sink 30 and the module substrate is successfully suppressed with respect to the X-direction. In the Y-direction, on the other hand, the heat sink 30 has a high rigidity and the difference in the thermal expansion between the heat sink 30 and the module substrate directly leads to a thermal stress that acts upon the interface wherein the heat sink 30 is bonded upon the module substrate. In a typical example wherein aluminum is used for the heat sink, the heat sink has a thermal expansion coefficient of about $24 \times 10^{-6}/°C$. On the other hand, a typical ceramic module substrate has a thermal expansion coefficient of $4-7 \times 10^{-6}/°C$. Thus, it will be noted that the thermal expansion coefficient of the heat sink is four–six times larger than that of the ceramic substrate. Such a large difference in the thermal expansion inevitably causes a large thermal stress acting at the interface between the heat sink and the substrate as mentioned above, and there is a substantial risk that the bonding of the heat sink may come off or the module substrate is cracked. Such a tendency appears conspicuous with increasing performance of the electronic apparatuses and increasing heat generation of the module substrate. Further, such a tendency is enhanced with a increasing size of the module substrate.

SUMMARY OF THE INVENTION

Accordingly, it is a general object of the present invention to provide a novel and useful heat sink structure and an electronic apparatus having such a heat sink structure wherein the foregoing problems are eliminated.

Another and more specific object of the present invention is to provide a heat sink structure having an improved efficiency of cooling and an electronic apparatus that uses such a heat sink structure on a substrate.

Another object of the present invention is to provide a heat sink structure and an electronic apparatus that uses such a heat sink structure on a substrate, wherein the thermal stress is minimized.

Another object of the present invention is to provide a heat sink structure and an electronic apparatus that uses such a heat sink structure on a substrate, wherein the fabrication cost is reduced.

Another object of the present invention is to provide a heat sink structure, comprising:

a plurality of cooling fins extending substantially parallel with each other in a longitudinal direction of said heat sink from a first end to a second, opposite end of said heat sink, each of said plurality of cooling fins being disposed adjacent with each other in a lateral direction with a mutual separation and having a top edge and a bottom edge extending in said longitudinal direction;

a plurality of bottom connection members each connecting a pair of said cooling fins with each other at said bottom edges, said bottom connection member having a surface adapted for contact with a heat source for conducting heat generated at said heat source to said pair of cooling fins; and a plurality of ceiling members each connecting a pair of said cooling fins with each other at said top edges, said ceiling member extending from said first end to said second end of said cooling fins so as to form a surrounded path of cooling air between said heat sink and said heat source such that said surrounded path extends from said first end to said second end of said cooling fins.

According to the present invention, the cooling air passes through the surrounded path from the first end to the second end without escaping outside, and the efficiency of cooling is improved significantly, even when a length between the first end and the second end is increased. It will be noted that such a construction of the cooling fin substantially increases the effective area of the cooling fin for contacting with the cooling air. Thus, the heat sink structure of the present invention is suitable for cooling a large size module substrates that could not be cooled effectively in the conventional heat sink structures.

In a preferred embodiment, said bottom member and said ceiling member are disposed alternately in said lateral direction such that a pair of cooling fins connected with each other by said bottom member and a pair of cooling fins connected with each other by said ceiling member share one cooling fin commonly. According to the present invention, the heat sink structure can deform easily in the lateral direction and accumulation of thermal stress at the interface between said bottom connection member and said heat source is successfully eliminated.

In another preferred embodiment, said cooling fins and said ceiling members includes a number of first group cutouts that divide said cooling fins and said ceiling members into a number of segments aligned in said longitudinal direction, and said cooling fins and said bottom members includes a number of second group cutouts that divide said cooling fins and said bottom members into a number of pieces in said longitudinal direction. According to the present invention, the heat sink structure can deform easily in the longitudinal direction and the accumulation of thermal stress at an interface between said bottom member and said heat source is successfully eliminated.

Other objects and further features of the present invention will become apparent from the following detailed description of preferred embodiments when read in conjunction with the attached drawings.

BRIEF DESCRIPTION OF THE DRAWINGS

FIGS. 9(A)–9(D) are diagrams showing the heat sink structure of FIG. 8 in various angles;

DETAILED DESCRIPTION OF THE PREFERRED EMBODIMENTS

Before starting description of the heat sink structure of the present invention, a substrate to which the heat sink structure of the present invention is applied will be described briefly with reference to FIG. 5.

Figure 5:
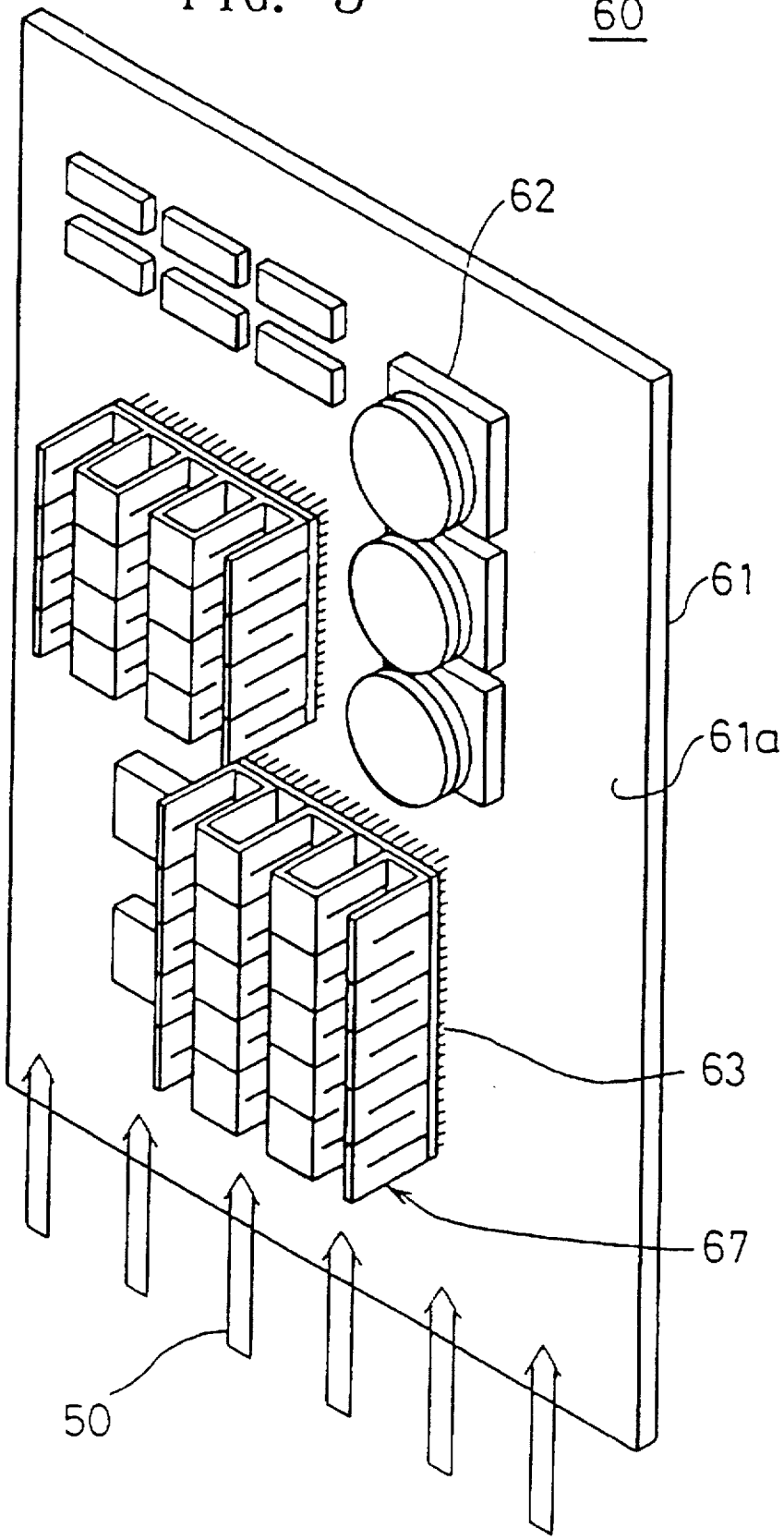
FIG. 5 is a diagram showing the construction of a mother board on which a module substrate is mounted together with a heat sink structure of the present invention.

Referring to FIG. 5, showing an electronic apparatus 60 constructed upon a mother board 61, the mother board 61 has an upper principal surface 61a on which a plurality of semiconductor devices 62 as well as a plurality of circuit modules 63 are provided.

Figure 1A:
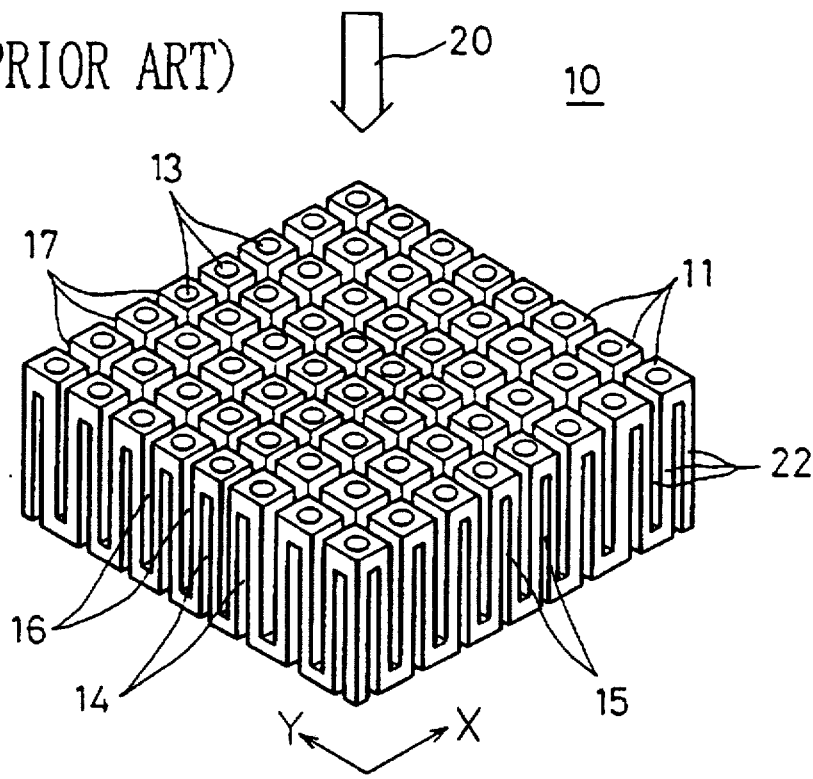
FIGS. 1(A) and 1(B) are diagrams showing the construction of a conventional heat sink structure for use in an electronic circuit substrate.
Figure 1B:
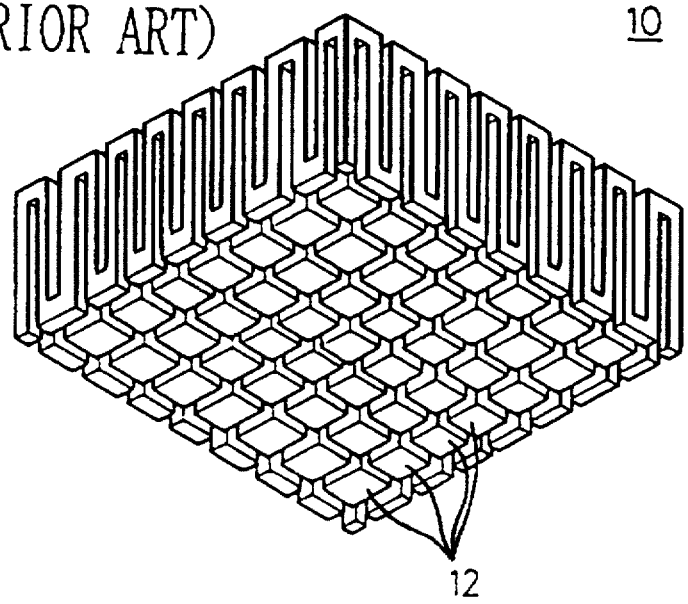
Figure 6:
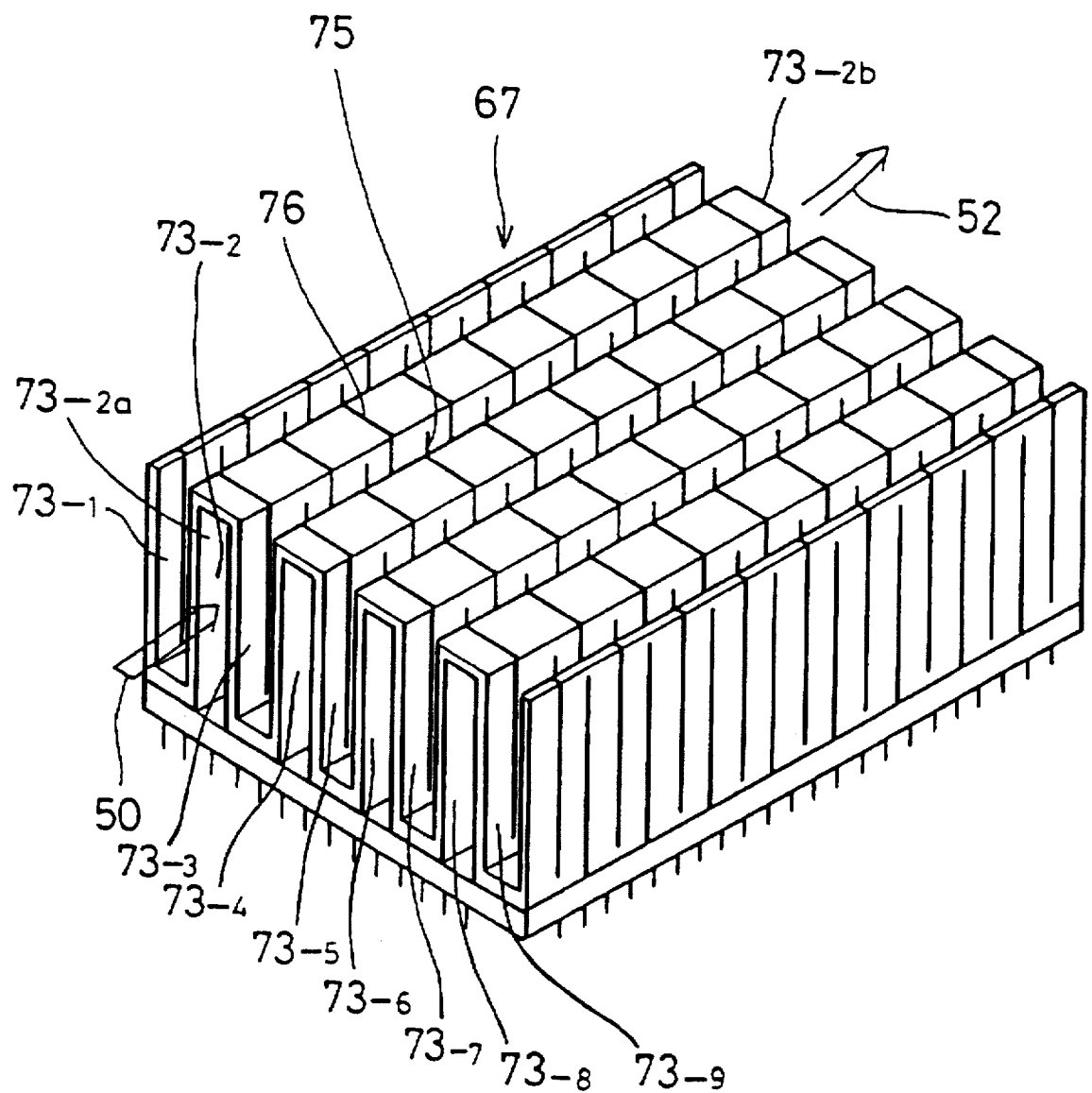
FIG. 6 is a diagram showing the construction of the heat sink structure according to a first embodiment of the present invention in a perspective view.
Figure 7:
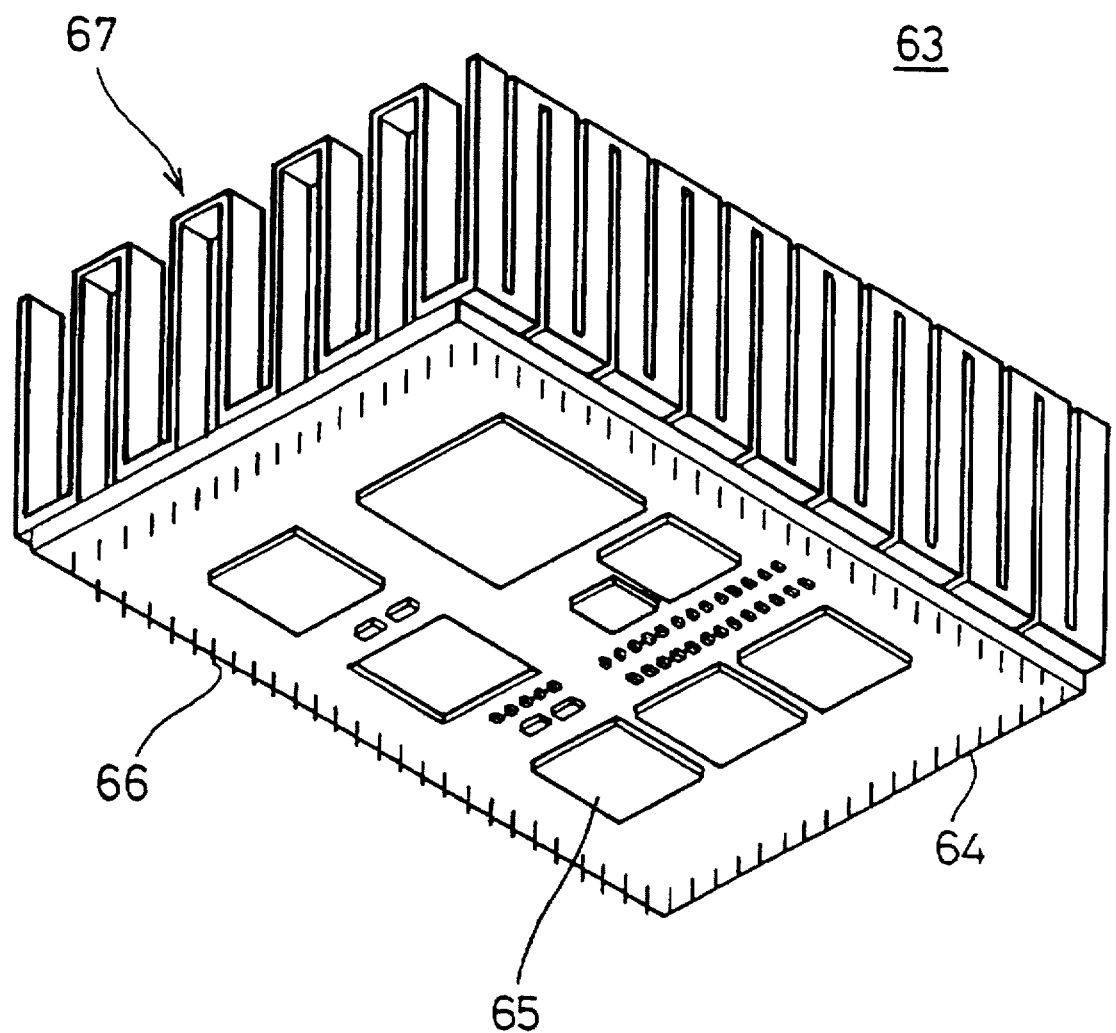
FIG. 7 is a diagram similar to FIG. 6 showing the construction of the heat sink structure of FIG. 6 together with the module substrate from another angle.

The module 63, as shown in FIG. 7, includes a ceramic module substrate 64 having upper and lower principal surfaces, wherein the lower principal surface of the module substrate 64 carries thereon a plurality of semiconductor devices 65 according to a flip-chip process as indicated in FIGS. 6 and 7. The substrate 64 further carries a pin array 66 along a peripheral part of the lower principal surface for mounting the module 63 upon the mother board 61, and a heat sink 67 is provided on the upper principal surface of the module substrate 64. Typically, the heat sink 67 is soldered upon the upper principal surface of the module substrate 64. Further, the module 63 is mounted upon the mother board 61 by soldering the pin array 66. A number of the mother boards such as the one shown in FIG. 5 are disposed within a housing of an electronic apparatus such as computer in a parallel relationship with each other, and a cooling air flow 50 is supplied to the mother boards as indicated in FIG. 1 for cooling the components provided thereon.

Next, a first embodiment of the heat sink of the present invention will be described with reference to FIG. 8 as well as FIGS. 9(A)–9(D).

Figure 8:
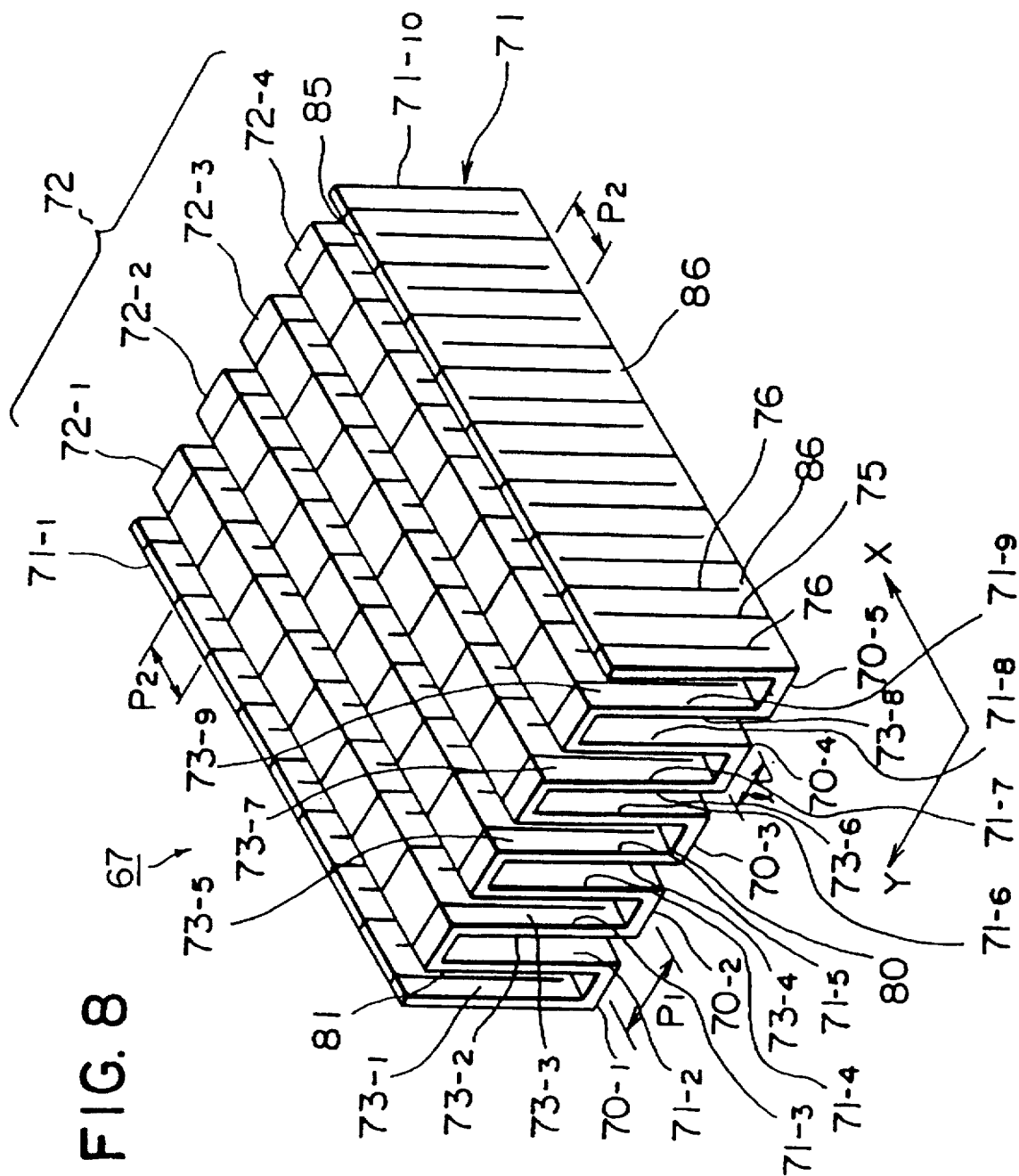
FIG. 8 is a diagram showing the construction of the heat sink structure of FIG. 6 in detail.

Referring to the drawings, the heat sink 67 is typically formed of a metal such as aluminum alloy or copper alloy or a ceramic material such as aluminum nitride or silicon carbide, and generally includes heat conduction members $70_{-1}$–$70_{-5}$ collectively designated as 70 and fins $71_{-1}$–$71_{10}$ collectively designated as 71, as well as ceiling members $72_{-1}$–$72_{-4}$ collectively designated as 72, wherein each of the heat conduction members $70_{-1}$–$70_{-5}$ extends in an X-direction and is disposed repeatedly in a Y-direction with a pitch $P_1$ as indicated in FIG. 8. Each of the heat conduction members $70_{-1}$–$70_{-5}$ has a pair of lateral edges extending in the X-direction and the fins $71_{-1}$–$71_{10}$ extend generally vertically at the lateral edges of the heat conduction members $70_{-1}$–$70_{-5}$. Thus, the fins $71_{-1}$–$71_{-10}$ extend parallel with each other in the X-direction, and passages $73_{-1}$–$73_{-9}$ for cooling air flow are formed between the cooling fins $71_{-1}$–$71_{-10}$.

In the heat sink 67 of the present embodiment, a pair of cooling fins, connected with each other by a heat conduction member 70, such as the fins $71_{-1}$ and $7_{-2}$, are connected with another similar pair of cooling fins such as the fins $71_{-3}$ and $71_{-4}$, by means of a ceiling member such as the member $72_{-1}$. The ceiling member $72_{-1}$ connects the top edge of the fin $71_{-2}$ and the top edge of the fin $71_{-3}$, and fins $71_{-2}$ and $71_{-3}$ as well as the ceiling member $72_{-1}$ surrounds the passage $73_{-2}$ of the cooling air. Similarly, the ceiling member $72_{-2}$ connects the fin $71_{-4}$ and the fin $71_{-5}$, the ceiling member connects the fin $71_{-6}$ and the fin $71_{-7}$, and the ceiling member $72_{-4}$ connects the fin $71_{-8}$ and the fin $7_{-9}$. In such a structure, the heat sink 67 has a rectangular-wave-like cross section when viewed in the X-direction as will be described with reference to FIG. 9(B).

In such a structure, it should be noted that the surface of the heat sink 67 that is mounted upon the heat source is segmented into a number of parts corresponding to the heat conduction members $70_{-1}$–$70_{-5}$. Typically, each heat conduction member has a lateral width $l_1$ of about 12 mm or less. Further, the heat sink 67 is formed with a first group of slits 75 and a second group of slits 76, wherein each of the slits 75 and 76 extends vertically and divides the heat sink 67 into a number of segments aligned in the X-direction. Thus, the first group slits 75 extend vertically from the heat conduction member 70 toward the top edge of the cooling fin 71 while the second group slits 76 extend vertically from the top edge of the cooling fin 71 toward the heat conduction member 70. Each first group slit 75 reaches a region in the vicinity of the ceiling member 72, and the segmented parts of the fin 71, thus divided by the slits 75, are connected with each other by the ceiling member 72. On the other hand, each second group slit 76 reaches a region in the vicinity of the heat conduction member 70, and the segmented parts of the fin 71 thus segmented by the slits 76 are connected with each other by the heat conduction member 70. Thus, the slits forming the first group slit 75 and the slits forming the second group slit 76 are formed with a common pitch $P_2$ but offset from each other by a half pitch $P_2/2$.

FIGS. 9(A)–9(D) show the heat sink 67 respectively in a plan view, side view, front view and bottom view, wherein .it will be noted that the slits 75 and 76 are in a staggered relationship with respect to each other in the X-direction as indicated in the plan view of FIG. 9(A) or in the bottom view of FIG. 9(D), wherein FIG. 9(A) indicates that the ceiling members 72 ($72_{-1}$–$72_{-4}$), segmented by the second group slit 76, have no first group slit 75 formed thereon, while FIG. 9(D) indicates that the heat conduction members 70 ($70^{-1}$–$70_{-5}$), segmented by the first group slit 75, have no second group slit 76 formed thereon. In FIG. 9(A), it will be noted that the ceiling members $72_{-1}$–$72_{-4}$ are segmented into a number of segments $72_{1a}$–$72_{4a}$ respectively by the slits forming the second group slit 76, while in FIG. 9(D), it is shown that the heat conduction members $70_{-1}$–$70_{-5}$ are segmented into a number of segments $70_{1a}$–$70_{-5a}$ by the slits that form the first group slit 75.

FIG. 9(B) shows the side view of the heat sink 67 as viewed in the X-direction of FIG. 8, wherein it will be noted that the side view of FIG. 9(B) indicates the rectangular-wave-like appearance of the heat sink 67 described previously. Further, the front view of FIG. 9(C) shows the segmented heat sink 67 as viewed in the Y-direction of FIG. 8, wherein it will be noted that the slits 75 and 76 are formed repeatedly and alternately on the cooling fin $71_{-10}$ with a mutual separation of $l_2$. In the heat sink 67 of the present embodiment, it is preferable to set the separation $l_2$ to be about 12 mm or less.

Because of the fact that each of the cooling fins $71_{-1}$–$71_{-10}$ is formed with the slits of the first and second groups 75 and 76 with the overall pitch of $P_2/2$ as indicated in FIG. 9(C), the heat sink 67 shows a very small rigidity against deformation in the X-direction. It should be noted that the segmented parts of the heat conduction member as well as the segmented parts of the ceiling member are connected to the adjacent segmented part with a very thin bridging part 86 shown in FIG. 9(C), and such a bridging part 86 easily experiences deformation when a stress is applied in the X-direction. Further, the heat sink 67 deforms easily in the Y-direction in view of the rectangular-wave-like cross section shown in FIG. 9(B), wherein the cooling fins $71_{-1}$–$71_{-10}$ are connected to the corresponding heat conduction members $70_{-1}$–$70_{-5}$ as well as to the ceiling members $72_{-1}$–$72_{-4}$ at thin bridging parts 80 and 81 respectively. It will be understood that such thin bridging parts 80 and 81 easily experience deformation upon the stress acting in the Y-direction.

Hereinafter, the thermal resistance of the heat sink 67 will be examined.

As shown in FIG. 6, the heat sink 67 is mounted upon the module substrate 64 by bonding the heat conduction member 70 on the substrate 64. In the illustrated example, the heat sink 67 has nine passages $73_{-1}$–$73_{-9}$ of the cooling air flows, wherein four of the nine passages, $73_{-2}$, $73_{-4}$, $73_{-6}$ and $73_{-8}$ are covered by the ceiling members $72_{-1}$–$72_{-4}$ respectively and form a tunnel structure. Further, the air passages having such a tunnel structure lack the heat conduction member at the bottom part. In such a structure, the cooling air 50 that has entered into one such tunnel passage such as $73_{-2}$ does not escape outside even when there occurs a pressure loss in the passage $73_{-2}$ as a result of the friction. Thus, the cooling air flow 50 reaches an outlet $73_{-2b}$ of the passage without being lost and exhausted as indicated by an arrow 52. It should be noted that the loss of the cooling air through the slits 75 or 76 is insubstantial. In other words, the cooling air 50 flows through the passage $73_{-2}$ with reliability.

Figure 2:
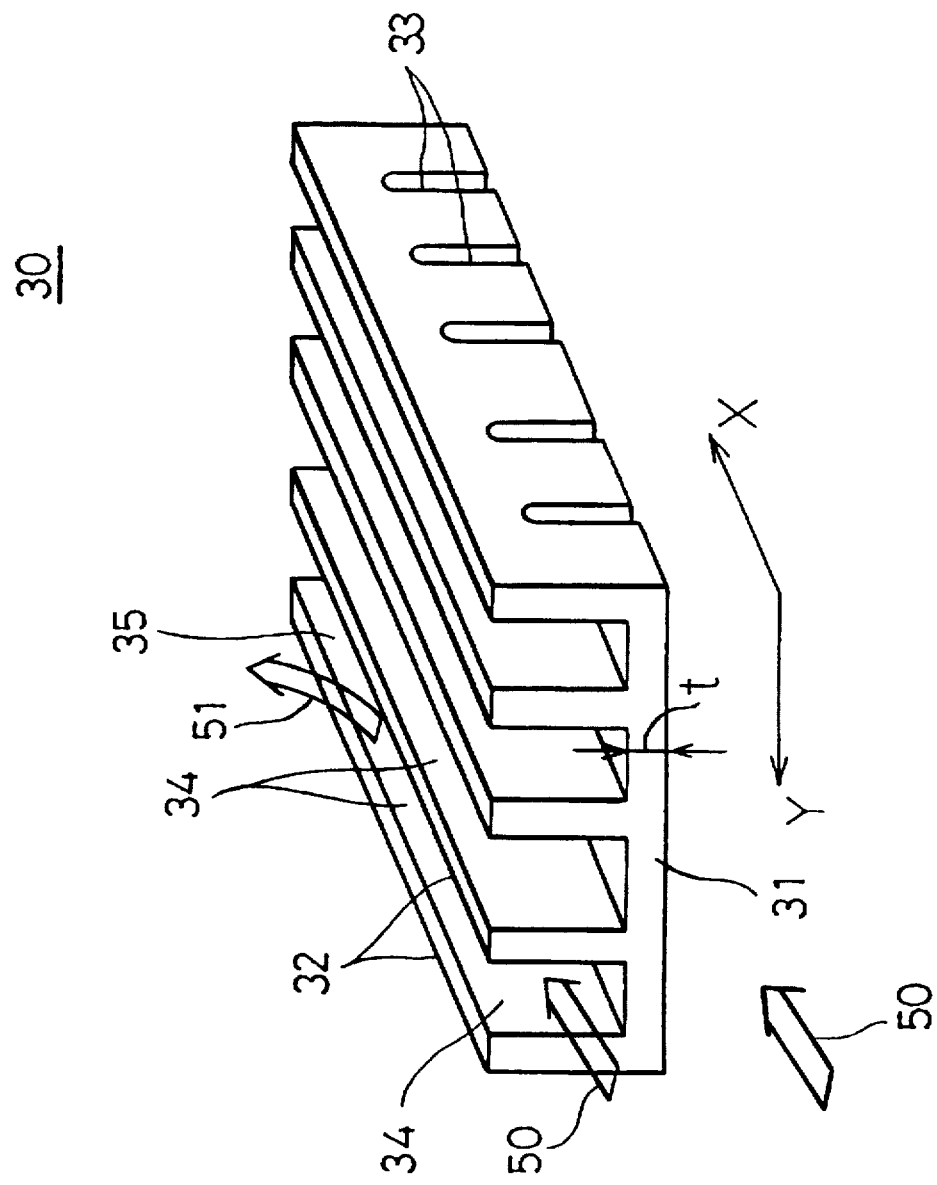
FIG. 2 is a diagram showing the construction of another conventional heat sink structure.
Figure 3:
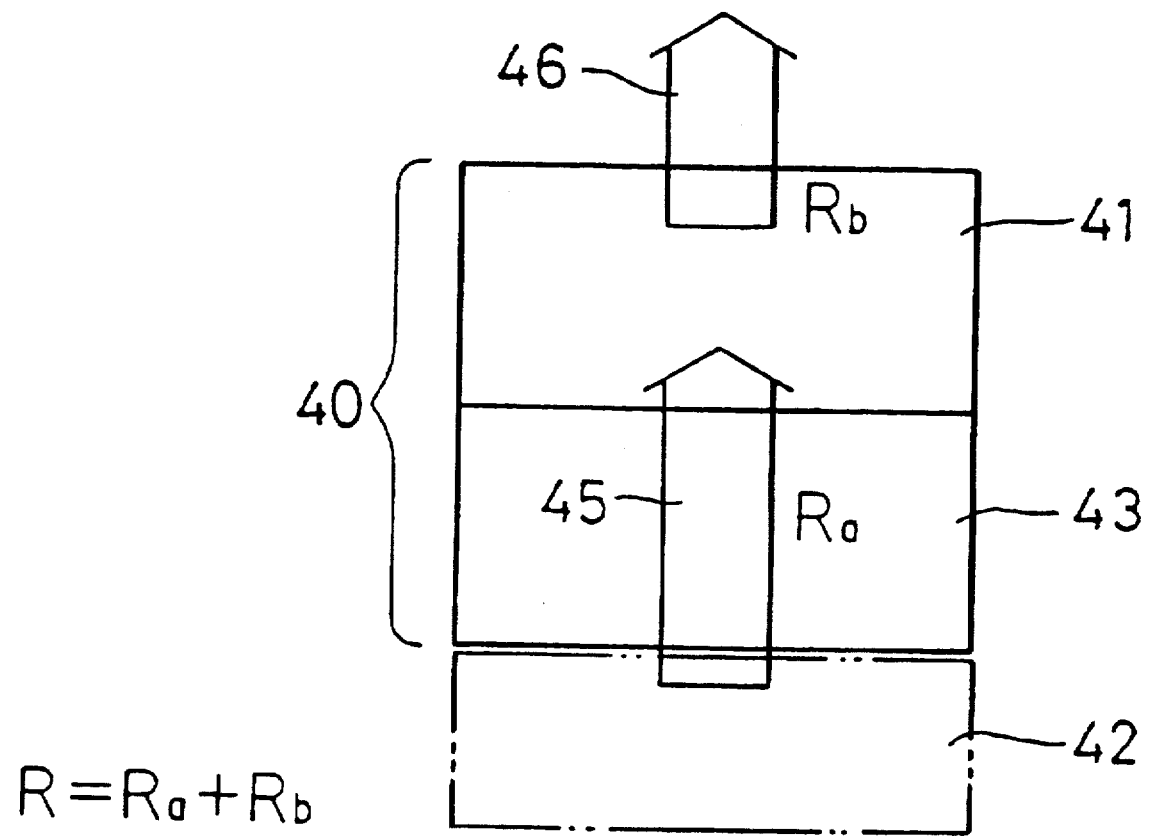
FIG. 3 is a diagram showing the operation of a conventional heat sink structure provided on a substrate.
Figure 4:
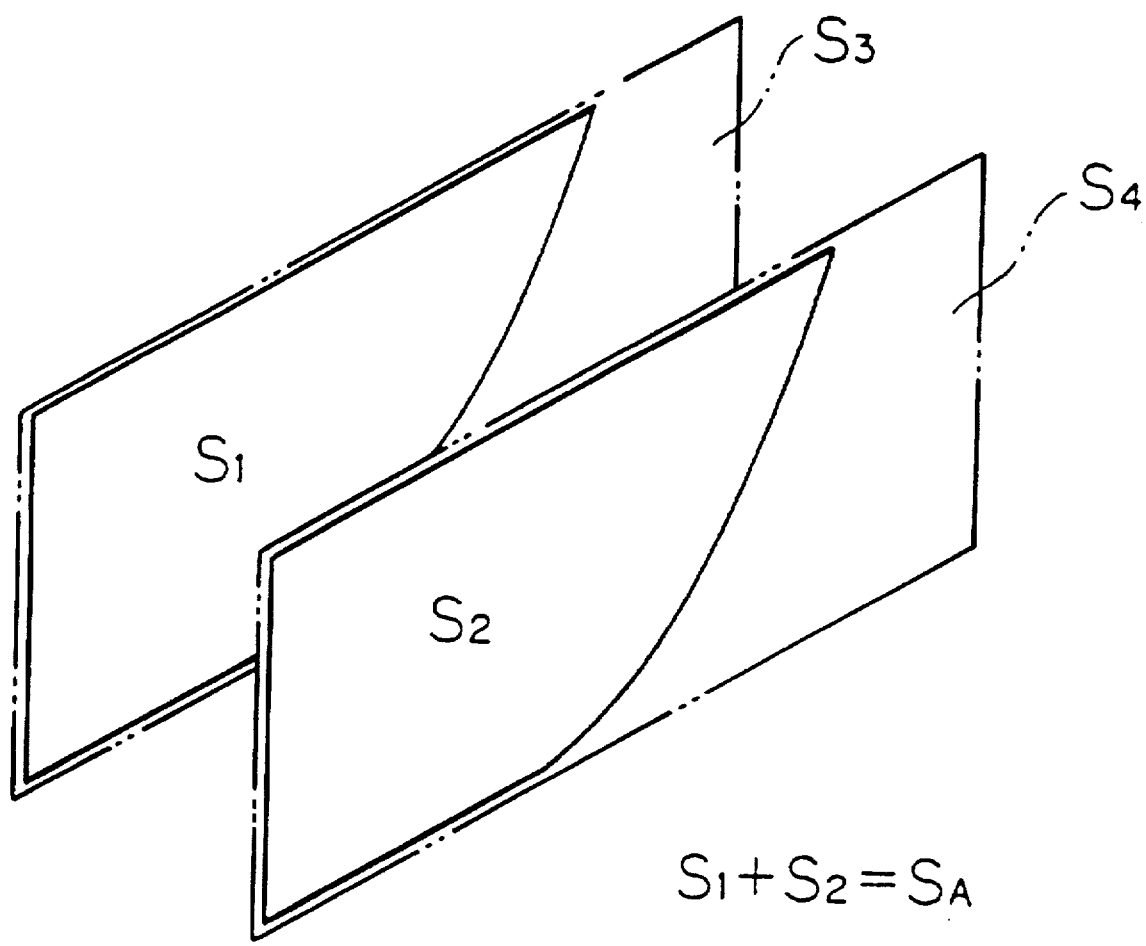
FIG. 4 is a diagram for explaining the problem associated with the conventional heat sink structure of FIG. 3.
Figure 10:
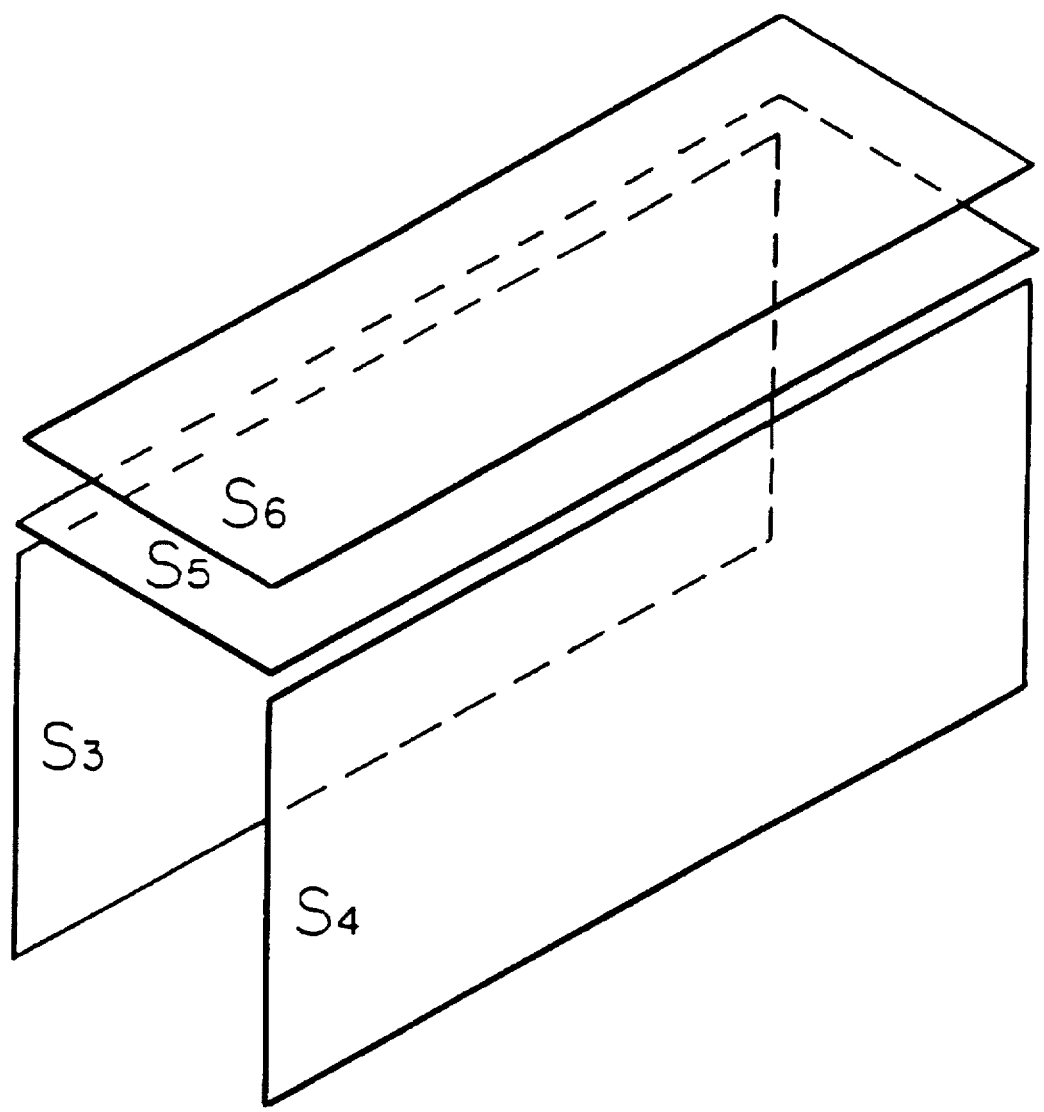
FIG. 10 is a diagram showing the effective surface that is cooled by a cooling air flow.

In such a passage having the tunnel structure, it should be noted that the exchange of heat occurs over a total surface area $S_B$ that is given as a sum of an area $S_3$ that represents the surface area of the fin $71_{-2}$, an area $S_4$ that represents the surface area of the fin $71_{-3}$, an area $S_5$ that represents the area of the lower surface of the ceiling member $72_{-1}$, and an area $S_6$ representing the area of the upper surface of the ceiling member $72_{-1}$. See FIG. 10. Thus, the total area $S_B$ becomes substantially twice as large as the conventional area $S_A$ shown in FIG. 4. In Eq.(1), the area $S_B$ substitutes for the term $A_f$. It will be noted that the thermal resistance Rb of the heat sink 67 for dissipating heat from the fins $71_{-2}$ and $71_{-3}$ as well as the ceiling member $72_{-1}$ by heat conduction or convection is substantially reduced with respect to the thermal resistance Rb for the heat sink 30 of FIG. 2. The same argument holds for other tunnel passages $73_{-4}$, $73_{-6}$ and $73_{-8}$. On the other hand, the other passages $73_{-1}$, $73_{-3}$, $73_{-5}$, $73_{-7}$ and $73_{-9}$ have a U-shaped cross section and ends thereof has a thermal resistance similar to that of the passages of the heat sink 30 of FIG. 2. Thus, it will be understood that the heat sink 67 of the present embodiment has a substantially reduced thermal resistance as compared with the conventional heat sink 30.

Figure 16:
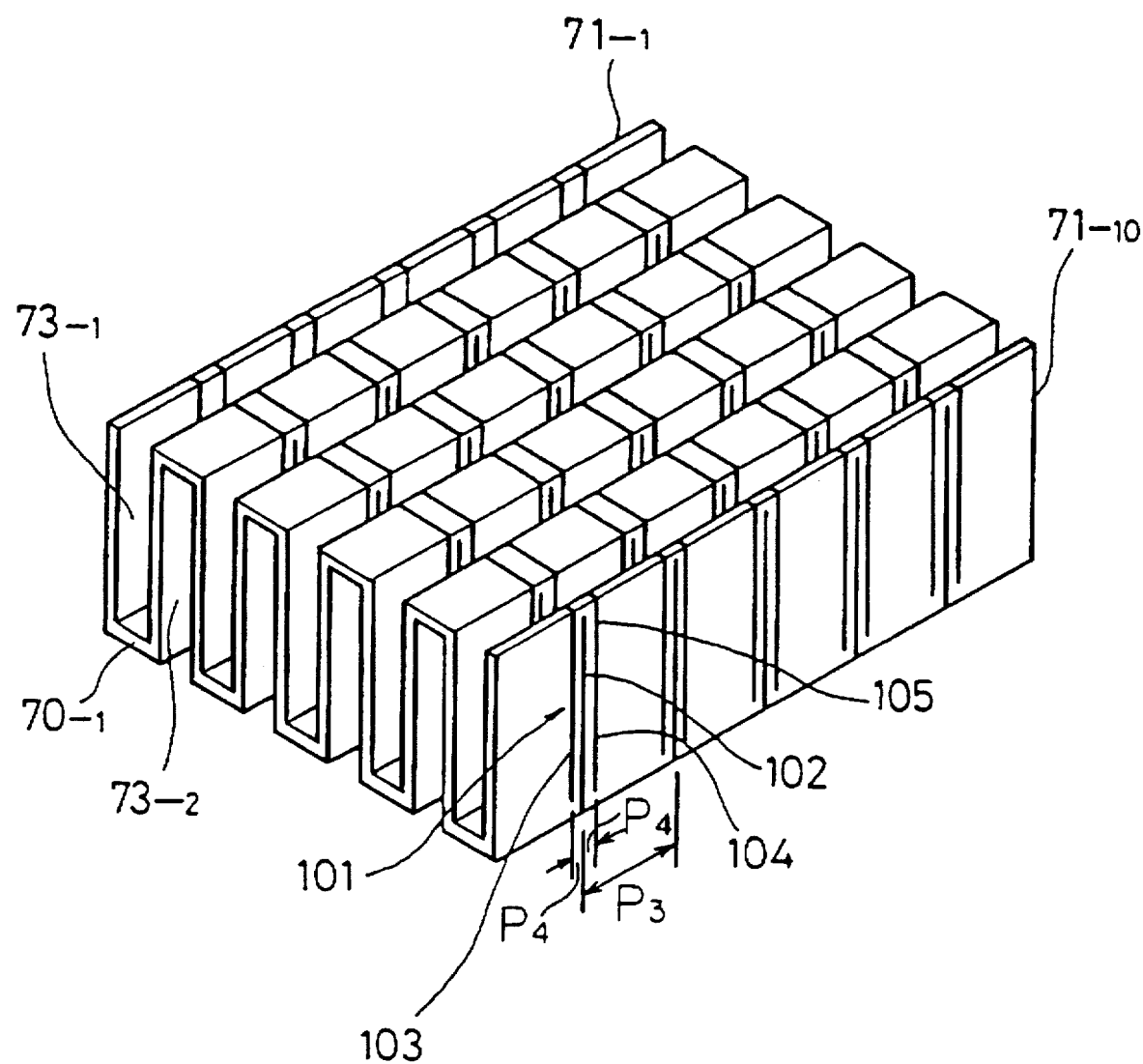
FIG. 16 is a diagram showing the heat sink structure according to a second embodiment of the present invention.

Because of the fact that the heat sink 67 has a reduced area with respect to the heat conduction member 70, there may occur a decrease in the value of the parameter A of Eq.(1), and such a decrease in the parameter A may act to increase the thermal resistance $R_a$ as compared with the conventional heat sink 16 of FIG. 16. However, the parameter A is included in the denominator of Eq.(1) in the form of $t/\lambda \cdot A$, and the contribution of this term is insignificant, particularly in view of the fact that the parameter t at the numerator is small, in the order of 0.002 m. Thus, even when the effect of decrease of the parameter A is taken into consideration, the heat sink 67 of the present invention is much more advantageous over the conventional heat sink. The heat sink 67 of the present invention is particularly effective when applied for the case wherein the wind speed (i.e., air flow rate) is held at 3 m/sec or less, in view of the fact that the passage of the cooling air through the heat sink becomes difficult when the wind speed is low.

Next, the absorption of the thermal stress in the heat sink 67 will be described. It should be noted that the heat sink 67 typically has a thermal expansion coefficient that is about 4–6 times larger than the thermal expansion coefficient of the module substrate 64. In the heat sink 67, such a difference in the thermal expansion coefficient may cause a thermal stress at the interface between the heat sink 67 and the substrate 64: (a) when mounting the heat sink 67; and (b) during the operation of the electronic apparatus.

First, the thermal stress caused at the time of mounting the heat sink 67 will be examined.

It should be noted that the heat sink 67 is mounted on the module substrate 64 when heated to about 150° C., by means of a solder alloy or epoxy resin. After mounting, the module substrate 63 is gradually cooled to a room temperature of 25° C.

Figure 11:
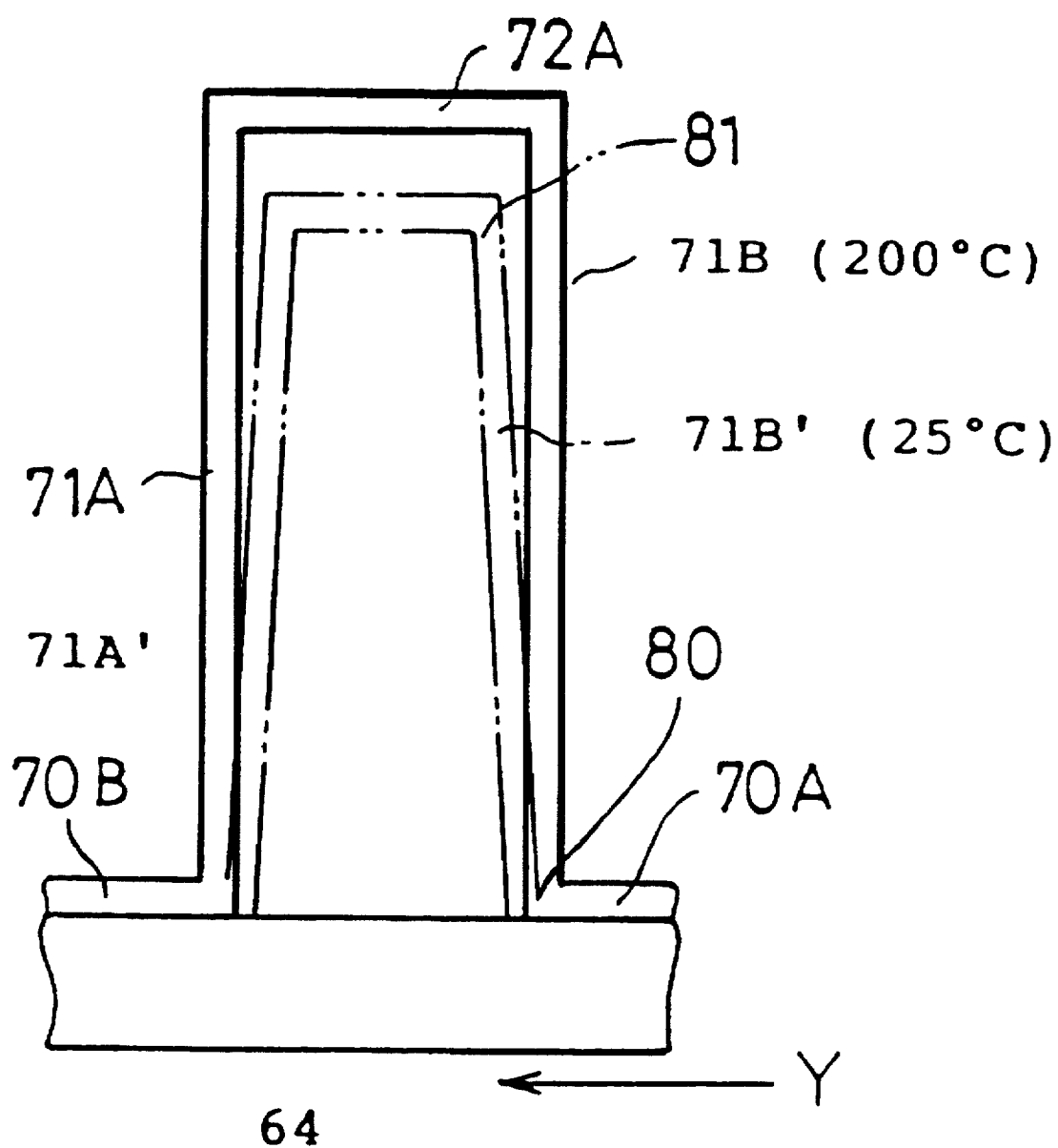
FIG. 11 is a diagram showing the thermal deformation of the heat sink structure of FIG. 8 upon mounting on the module substrate at an elevated temperature.

FIG. 11 shows the heat sink 67 on the module substrate 64 in a cross sectional view, in a plane along the Y-direction, wherein the continuous line represents the state corresponding to when the heat sink 67 is mounted at the temperature of 150° C., while the two-dotted line represents the state when the heat sink 67 is cooled to the room temperature. It will be understood that heat conduction members 70A and 70B are fixed upon the surface of the ceramic substrate 64 and shrink little with descent of the temperature, while the rest of the heat sink 67 such as a ceiling member 72A or fins 71A and 71B shrink substantially with the descent of the temperature as indicated by numerals 71A' or 71B'. The large difference in the thermal expansion thus caused, however, is successfully absorbed by causing a deformation at the bridging part 80. Thus, little thermal stress is accumulated at the interface wherein the heat conduction members 70A or 70B is bonded to the module substrate 64.

Figure 12:
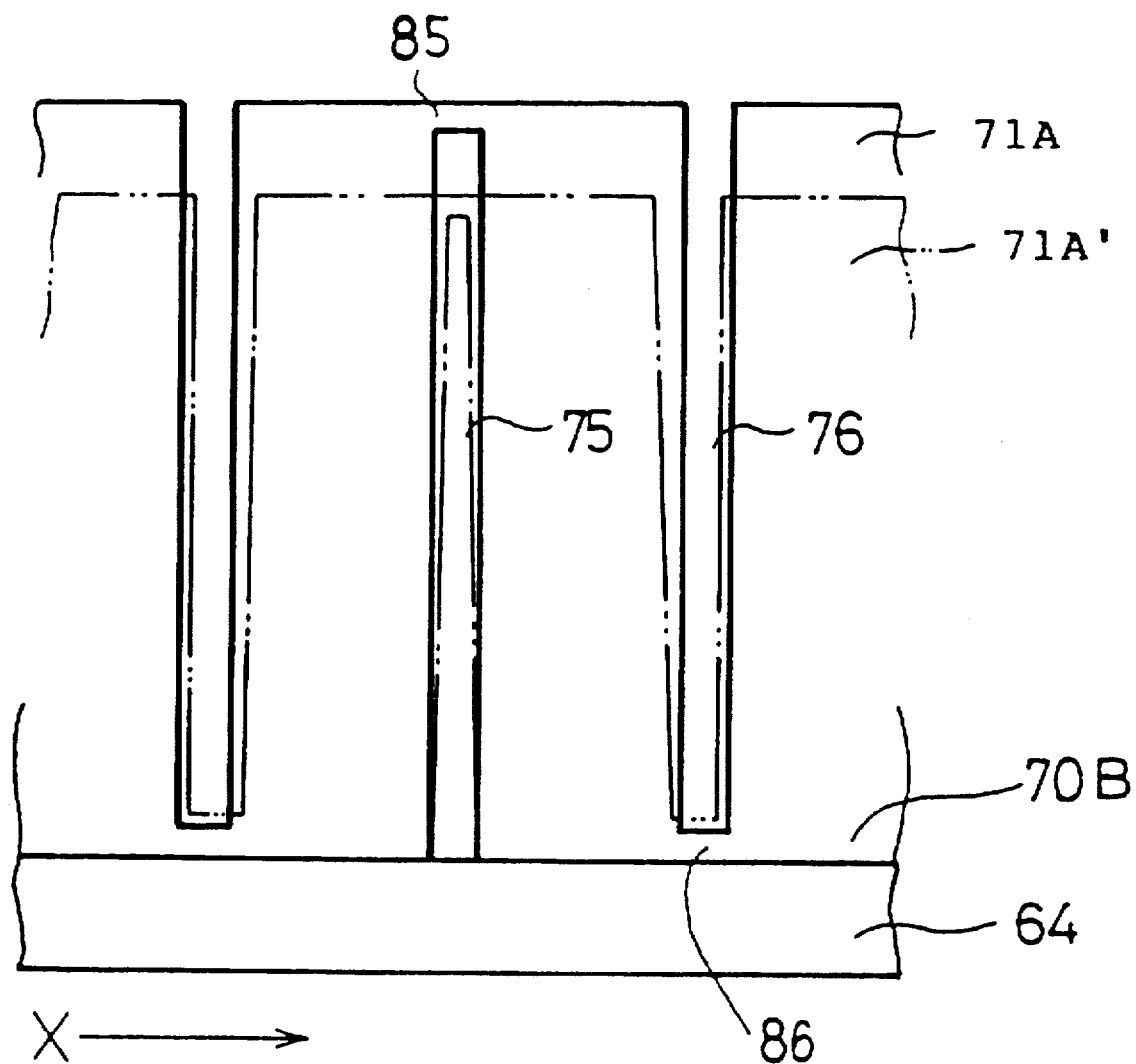
FIG. 12 is a diagram showing the thermal deformation of the heat sink structure of FIG. 11 in another angle.

FIG. 12 shows the deformation of the heat sink 67 in the cross sectional view taken along the X-direction, wherein it will be noted that the bottom part 70B of the cooling fin 71A, fixed upon the module substrate 64, experiences little shrinkage even when the temperature has been lowered to the room temperature. On the other hand, the rest of the fin 71A experiences a shrinkage with the descent of the temperature and the deformation occurs as indicated by the two-dotted line in FIG. 12, wherein such a deformation is successfully absorbed by the thin bridging parts 85 and 86 and the accumulation of the thermal stress acting in the X-direction is also eliminated effectively due to the slits 75 and 76.

Figure 13:
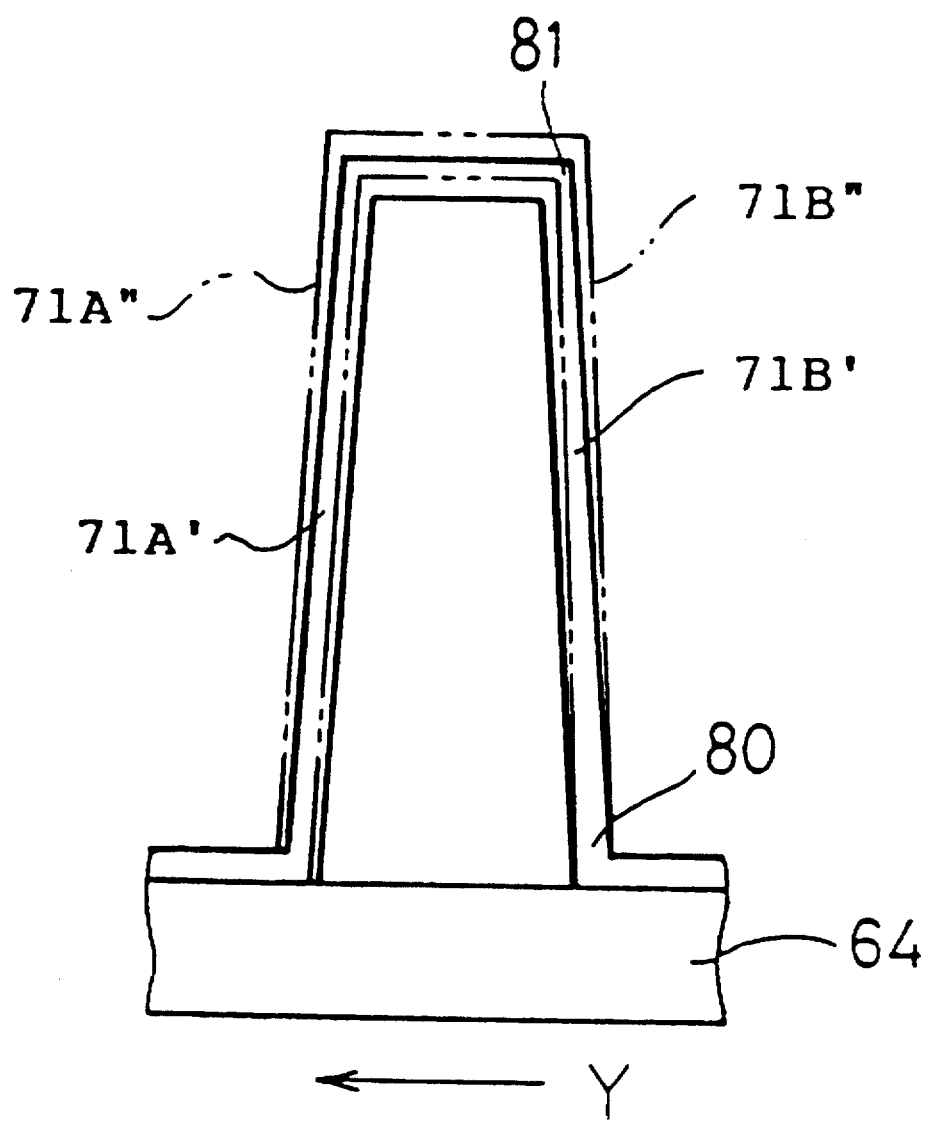
FIG. 13 is a diagram showing the thermal deformation of the heat sink structure occurring during the normal use of an electronic apparatus.
Figure 14:
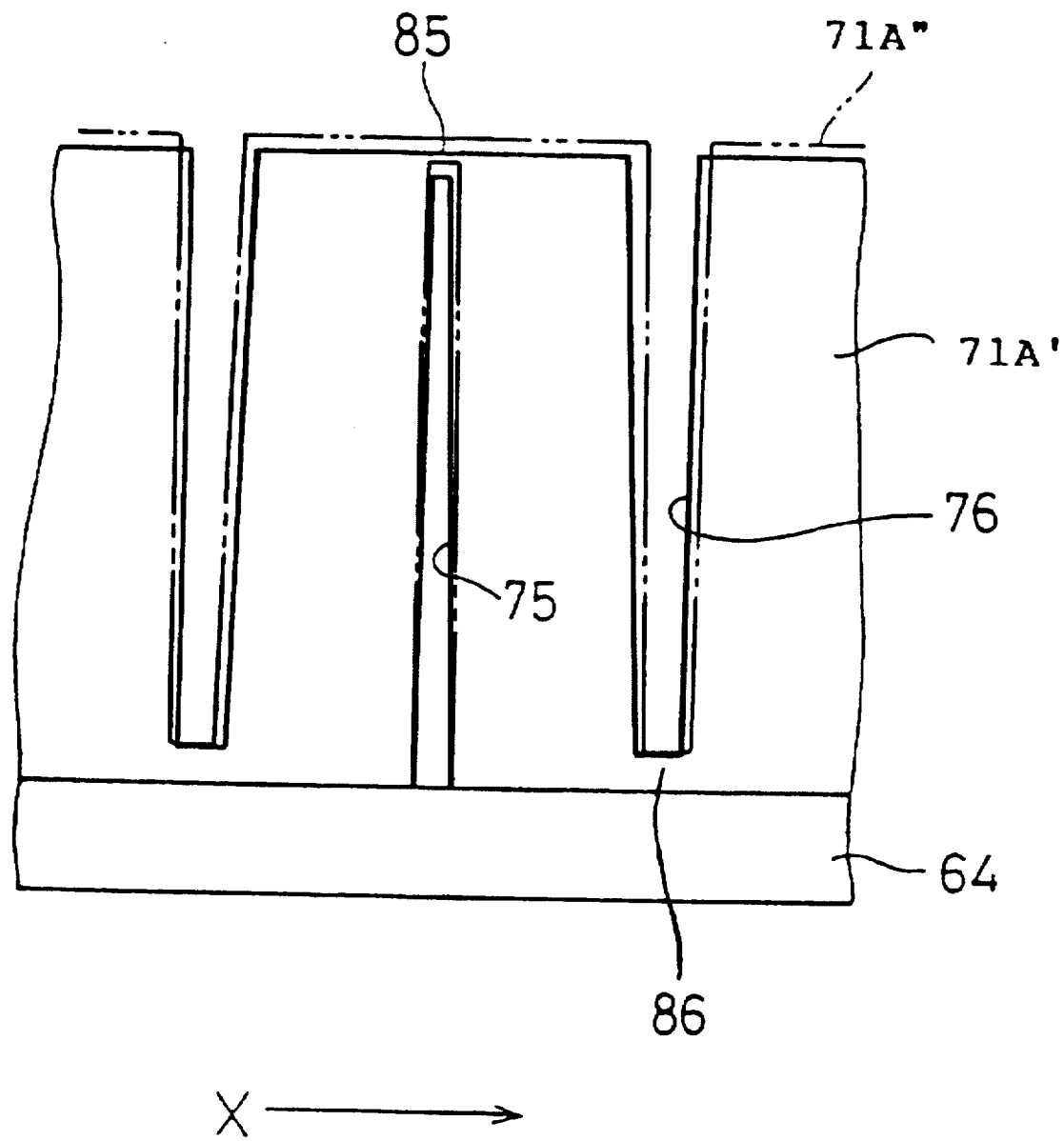
FIG. 14 is a diagram showing the thermal deformation of the heat sink structure of FIG. 13 in another angle.

Next, the deformation of the heat sink during the normal use of the electronic apparatus will be examined with reference to FIGS. 13 and 14. In the normal use of the electronic apparatus, the temperature of the apparatus may rise typically to about 70° C.

FIG. 13 corresponds to FIG. 11 and shows the cross sectional view of the heat sink 67 taken in the Y-direction, wherein the continuous line indicates the state wherein the electronic apparatus is not operated while the two-dotted line indicates the state wherein the electronic apparatus is operated. In such a case, too, the thermal stress at the interface between the heat sink 67 and the substrate 64 in the Y-direction is successfully eliminated by causing a deformation at the bridging parts 80 and 81.

FIG. 14 corresponds to FIG. 12 and shows the cross sectional view of the heat sink 67 taken in the X-direction, wherein the continuous line indicates the state wherein the electronic apparatus is not operated, while the two-dotted line indicates the state wherein the electronic apparatus is operated. In such a case, too, the thermal stress at the interface between the heat sink 67 and the substrate 64 is successfully eliminated by causing a deformation at the bridging parts 85 and 86. Thus, the thermal stress acting in the X-direction is successfully absorbed.

Thus, the heat sink 67 of the present invention successfully avoids the problems of the prior art such as the heat sink coming off from (i.e., being detached from) the substrate of the electronic apparatus or the substrate causing cracking after a repeated use.

Figure 15:
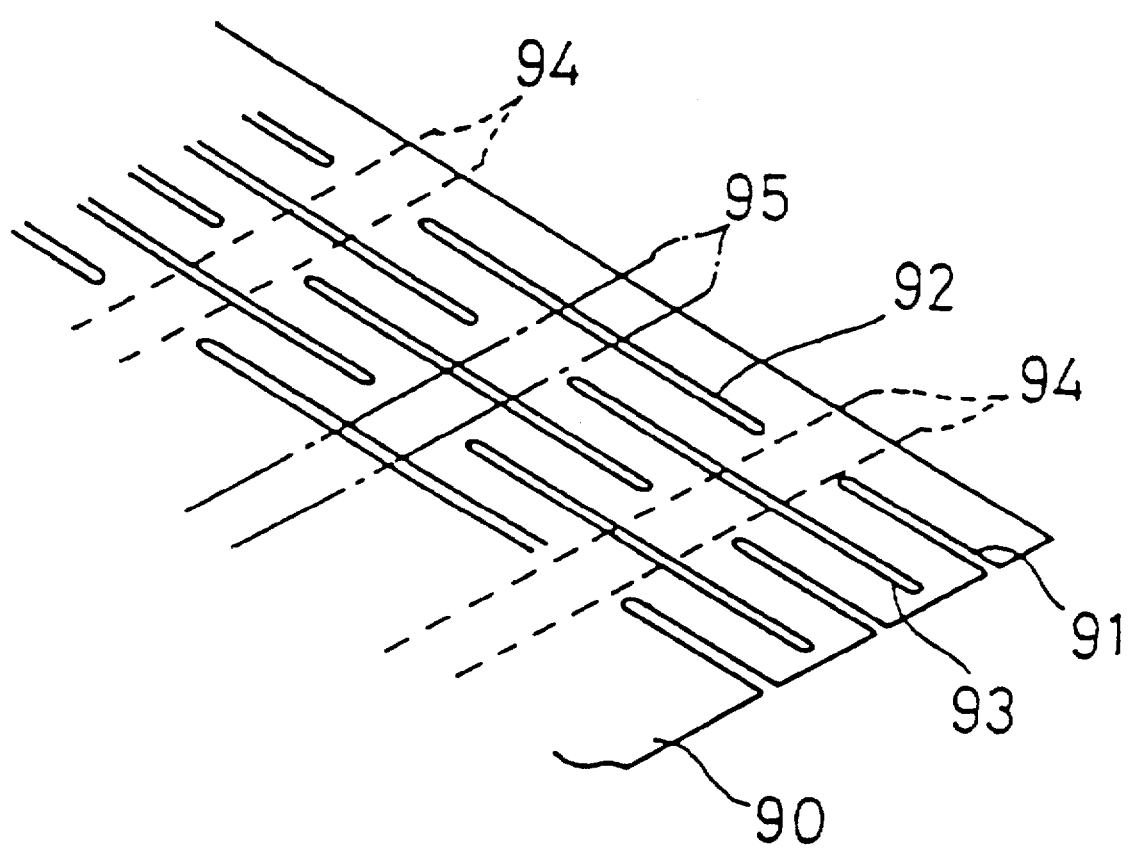
FIG. 15 is a diagram showing a manufacturing process of the heat sink structure of the present invention.

The heat sink 67 may be formed easily and with low cost by any procedures such as die-casting, casting, forging, machining, or pressing. For example, one may form cutouts 91–93 in correspondence to the slits 75 and 76, on a rolled metal sheet 90 as shown in FIG. 15, and then bend the metal sheet along a line 94 by a press shaping process, such that a part 95 forms the ceiling member 72.

Next, a second embodiment of the present invention will be described with reference to FIG. 16 that shows a heat sink 100.

Referring to FIG. 16, the heat sink 100 has a construction substantially identical to the construction of the heat sink 67 except for the pattern of the slits. In FIG. 16, it will be noted that the slits are grouped to form a number of slit groups 101 that are repeated with a pitch $P_3$. Each slit group 101 includes a central slit 102 that extends from the heat conduction member 70 toward the top edge of the cooling fin 71 and a pair of slits 103 and 104 disposed at both lateral sides of the central slit 102 so as to extend from the ceiling member 72 toward the bottom edge of the fin 71. The slits 103 and 104 are formed with a separation P4 of about 0.5–1.0 mm.

Figure 17:
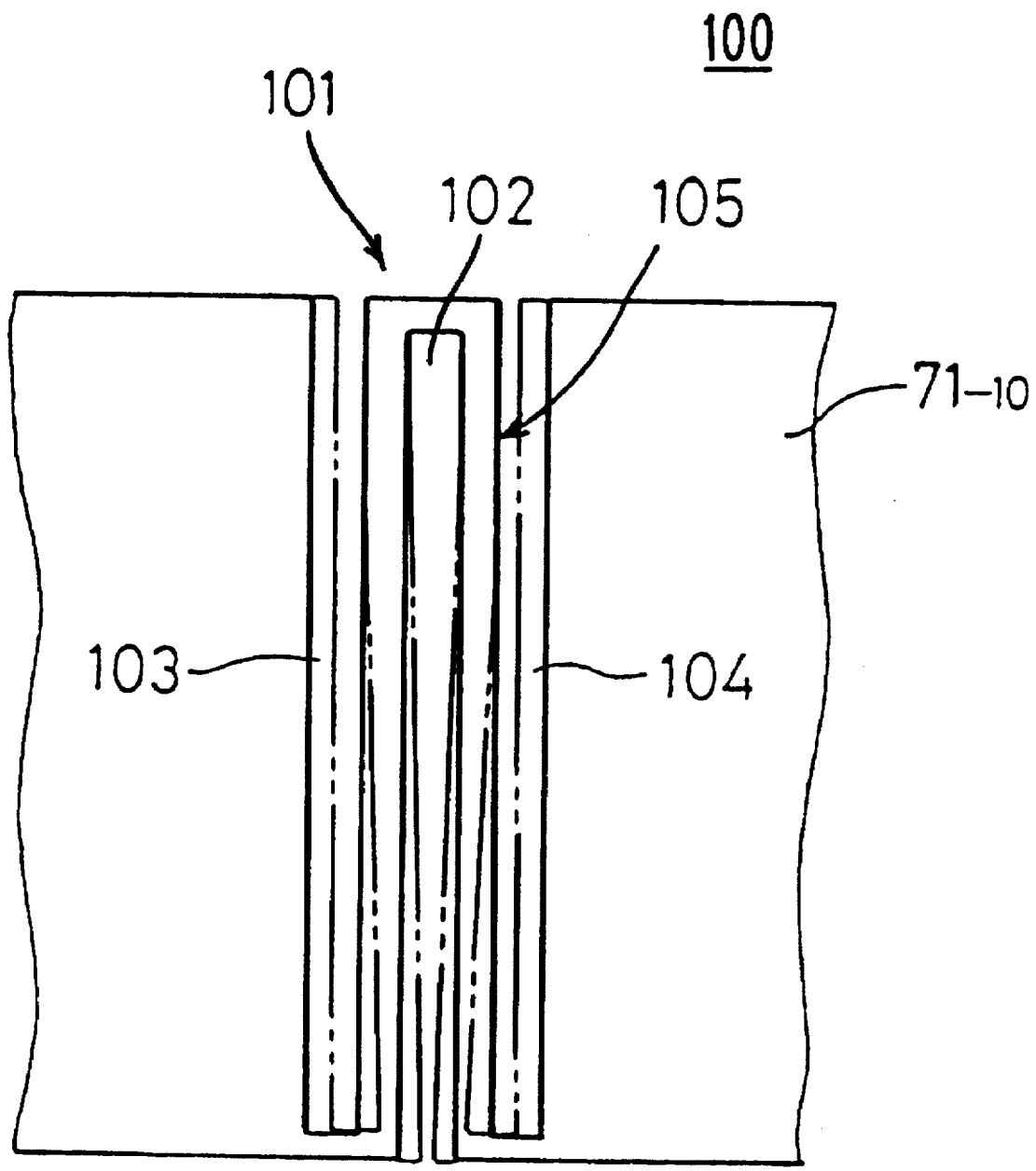
FIG. 17 is a diagram showing a part of the heat sink structure of FIG. 16 in detail.

FIG. 17 shows the slit group 101 in an enlarged scale, wherein there is formed an inverted U-shaped part 105 that is defined by the central slit 102 as well as the lateral slits 103 and 104. The inverted U-shaped part is deformed easily with little force as indicated by a two-dotted line. Thus, the heat sink 100' of FIG. 17 shows a significantly reduced rigidity in the X-direction as compared with the heat sink 67 of the previous embodiment.

It should be noted that the heat sink of the present invention may be provided on a semiconductor chip. Further, the heat sink may have a square shape rather than the rectangular shape when viewed in the plan view.

Figure 18:
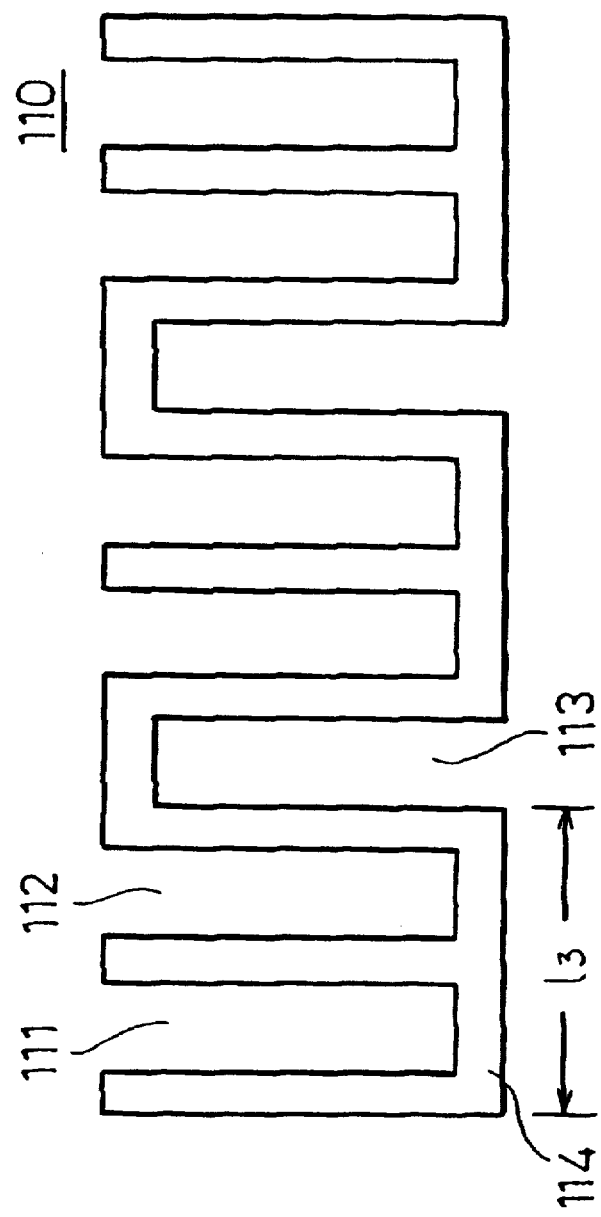
FIG. 18 is a diagram showing the heat sink structure according to a third embodiment of the present invention.

FIG. 18 shows a heat sink 110 according to a third embodiment of the present invention, wherein the heat sink 110 includes two U-shaped passages 111 and 112 formed adjacent with each other, and the passages 111 and 112 are repeated laterally with an intervening passage 113 having an inverted U-shape. Preferably, the passages 111 and 112 have a total width $l_3$ of less than 12 mm.

The heat sink 67, 100 or 110 of the present invention maintains a superior cooling efficiency even when the thin bridging part 85 or 86 or the inverted U-shaped part 105 is damaged. Further, such damaging does not degrade the bonding of the heat sink on the substrate. As already noted, the heat sink of the present invention is not limited for cooling the module substrates but may be used also for cooling semiconductor devices.

Further, the present invention is not limited to the embodiments described heretofore, but various variations and modifications may be made without departing from the scope of the invention.

What is claimed is:

1. A heat sink structure having first and second opposite ends spaced apart in a longitudinal direction, comprising:

plural cooling fins extending in substantially parallel relationship with respect to each other in the longitudinal direction from the first end to the second end of said heat sink structure, each as an effectively continuous planar surface, and spaced in a lateral direction, each cooling fin having a top edge and a bottom edge extending in said longitudinal direction;

a plurality of bottom members respectively interconnecting corresponding pairs of adjacent said cooling fins at said respective bottom edges thereof and extending in said longitudinal direction from said first end to said second end of said heat sink structure and having corresponding bottom surfaces adapted for contact with a heat source for conducting heat generated by said heat source to said corresponding pairs of cooling fins;

a plurality of ceiling members, each ceiling member comprising a substantially continuous planar surface, respectively interconnecting corresponding pairs of adjacent said cooling fins at said respective top edges thereof and extending from said first end to said second end of said heat sink structure, and defining therewith corresponding, substantially completely surrounded air flow paths in the longitudinal direction between said heat sink structure and said heat source and extending from said first end to said second end of said heat sink structure, any airflow in a direction transverse to the longitudinal airflow paths being insubstantial relatively to the airflow in the airflow path; and each of said bottom members being segmented into a plurality of bottom segments by a corresponding plurality of first cutouts disposed in parallel in the lateral direction and spaced in the longitudinal direction by a first pitch, each first cutout extending through the corresponding bottom member and through the pair of cooling fins interconnected thereby from the respective bottom edges thereof and toward the respective top edges thereof, each of said plurality of ceiling members being segmented into a plurality of ceiling segments by a corresponding plurality of pairs of second cutouts disposed in parallel in the lateral direction and spaced in the longitudinal direction by the first pitch, each ceiling segment being a continuous planar surface and extending continuously between successive pairs of second cutouts and the second cutouts of each pair being separated by a second pitch, substantially smaller than the first pitch, and defining therebetween a bridging ceiling portion of said corresponding ceiling member, each pair of second cutouts, further, extending on each of said pair of adjacent cooling fins, interconnected by said corresponding ceiling member, generally vertically from said respective top edges and toward said respective bottom edges thereof and being grouped, in each of the pair of adjacent cooling fins, with a respective said first cutout disposed therebetween and defining a corresponding deformable part having an inverted U-shaped configuration, the plural groups of corresponding pairs of second cutouts and respective first cutouts defining respective, plural deformable parts in said corresponding cooling fins spaced in said longitudinal direction at the first pitch and defining and flexibly interconnecting successive cooling fin segments, each successive cooling fin segment extending as a continuous planar surface continuously between successive said deformable parts.

2. A heat sink structure as claimed in claim 1, wherein said bottom connection members and said ceiling members are disposed in alternate succession in said lateral direction such that each pair of cooling fins interconnected by a corresponding said bottom connection member and a next successive pair of cooling fins, interconnected by the next successive said ceiling member, share one cooling fin in common.

3. A heat sink structure as claimed in claim 1, wherein said bottom connection members and said ceiling members are disposed in repeating, alternate succession in said lateral direction.

4. A heat sink structure as claimed in claim 1, wherein the respective pluralities of first cutouts, formed in the plurality of bottom members and in the associated pairs of cooling fins respectively interconnected thereby, are aligned in the lateral direction and the respective pluralities of pairs of second cutouts, formed in the plurality of ceiling members and in the associated pairs of cooling fins respectively interconnected thereby, are aligned in the lateral direction.

5. A heat sink structure as claimed in claim 4, wherein each bridging ceiling portion, as defined by an associated pair of second cutouts, interconnects the laterally aligned deformable parts commonly defined by the same pair of second cutouts in the cooling fins interconnected by the corresponding ceiling member.

6. A heat sink structure as claimed in claim 5, wherein each cooling fin segment extends continuously to, and forms an integral connection with, the bottom segment defined by the adjacent and common, first cutouts.

7. A heat sink structure having first and second opposite ends spaced apart in a longitudinal direction, comprising:
a continuous sheet of heat conductive material configured to have a cross sectional configuration substantially of a square wave extending in a lateral direction in a plane which is perpendicular to the longitudinal direction and defining plural cooling fins, extending in parallel relationship in the longitudinal direction, and plural ceiling members and plural bottom members, extending in parallel relationship in the longitudinal direction and respectively interconnecting respective upper edges and respective lower edges of adjacent said cooling fins in alternating succession;
the bottom members having respective lower surfaces adapted for contact with a heat source and conducting heat generated by the heat source to the corresponding cooling fins interconnected thereby and the adjacent pairs of cooling fins interconnected by a corresponding ceiling member defining therewith, relatively to the heat source, a surrounded airflow path extending in the longitudinal direction;
each ceiling member and corresponding pair of adjacent cooling fins interconnected thereby having respective pluralities of cutouts therein, the respective plurality of cutouts in each ceiling member defining therein an alternating succession of plural ceiling segments and plural ceiling bridging portions, each ceiling bridging portion being spaced between and separating successive ceiling segments and the respective pluralities of cutouts, in the pair of adjacent cooling fins interconnected by a respective said ceiling member, defining in each thereof an alternating succession of plural cooling fin segments and plural deformable parts, each of an inverted U-shaped configuration, the deformable parts being spaced at a first pitch in the longitudinal direction and having a length in the longitudinal direction which is substantially smaller than the first pitch, respective deformable parts of the pair of adjacent cooling fins being aligned in the lateral direction with, and interconnected by, a bridging portion of the corresponding ceiling member and flexibly interconnecting the successive cooling fin segments, each ceiling segment being aligned in the lateral direction with, and integrally interconnecting respective cooling fin segments of, the pair of cooling fins interconnected by the corresponding ceiling member, the respective pluralities of cutouts having a minimal dimension in the longitudinal direction so as to minimize air flow passage transversely through the cooling fin and ceiling members while permitting thermally induced relative displacements between respective interconnected cooling fin segments and ceiling member segments.

8. A heat sink structure as claimed in claim 7, wherein said bottom connection members and said ceiling members are disposed in alternate succession in said lateral direction such that each pair of cooling fins, interconnected by a corresponding said bottom connection member, and a next successive pair of cooling fins, interconnected by the next successive said ceiling member, share one cooling fin in common.

9. A heat sink structure as claimed in claim 7, wherein said bottom connection members and said ceiling members are disposed in repeating, alternate succession in said lateral direction.

10. A heat sink structure as claimed in claim 7, wherein each bottom member has a corresponding plurality of cutouts therein defining corresponding bottom segments and each cooling fin segment extends continuously to and forms an integral connection with a laterally aligned, respective bottom segment.

11. A heat sink structure having first and second opposite ends spaced apart in a longitudinal direction, comprising:
a continuous sheet of heat conductive material configured to have a cross sectional configuration substantially of a square wave extending in a lateral direction in a plane which is perpendicular to the longitudinal direction and defining plural cooling fins, extending in parallel relationship in the longitudinal direction, and plural ceiling members and plural bottom members, extending in parallel relationship in the longitudinal direction and respectively interconnecting respective upper edges and respective lower edges of adjacent said cooling fins in alternating succession;

the bottom members having respective lower surfaces adapted for contact with a heat source and conducting heat generated by the heat source to the corresponding cooling fins interconnected thereby and the adjacent pairs of cooling fins interconnected by a corresponding ceiling member defining therewith, relatively to the heat source, a surrounded airflow path extending in the longitudinal direction;

the ceiling and bottom members having respective pluralities of cutouts therein, extending in the lateral direction and spaced in parallel relationship in the longitudinal direction and defining plural ceiling segments in each of the plurality of ceiling members and plural bottom segments in each of the plurality of bottom members, the respective pluralities of segments of the ceiling and bottom members being aligned in the lateral direction;

the cooling fins having pluralities of cutouts therein aligned with the respective pluralities of cutouts in the ceiling and bottom members and defining a corresponding plurality of cooling fin segments, aligned in the lateral direction with and interconnecting corresponding ceiling and bottom member segments, the plurality of cutouts in each of the cooling fins furthermore defining a plurality of deformable parts spaced at a first pitch in the longitudinal direction, each of an inverted U-shaped configuration and having a length in the longitudinal direction which is substantially smaller than the first pitch, separating and flexibly interconnecting respective, successive cooling fin segments; and each cutout, of the respective pluralities of cutouts in the ceiling members and the cooling fins, having a minimal dimension in the longitudinal direction so as to minimize air flow passage transversely through the cooling fin and ceiling members while permitting thermally induced relative displacements between the successive cooling fin segments and ceiling member segments.

12. A heat sink structure as claimed in claim 11, wherein said bottom connection members and said ceiling members are disposed in alternate succession in said lateral direction such that each pair of cooling fins, interconnected by a corresponding said bottom connection member, and a next successive pair of cooling fins, interconnected by the next successive said ceiling member, share one cooling fin in common.

13. A heat sink structure as claimed in claim 11, wherein said bottom connection members and said ceiling members are disposed in repeating, alternate succession in said lateral direction.

14. A heat sink structure as claimed in claim 11, wherein each bottom member has a corresponding plurality of cutouts therein defining corresponding bottom segments and each cooling fin segment extends continuously to and forms an integral connection with a laterally aligned, respective bottom segment.

15. A heat sink structure, comprising:

a sheet of heat transfer material formed to have a rectangular-wave-like cross section when viewed in a first, longitudinal direction and comprising plural cooling fins disposed in spaced, parallel relationship in a second, lateral direction transverse to the first, longitudinal direction, alternate pairs of adjacent fins being integrally interconnected respectively, by bottom members and ceiling members respectively defining, and lying in, a common bottom plane and a common ceiling plane substantially parallel to the bottom plane, both thereof substantially perpendicular to the cooling fins; and the plural cooling fins and the associated bottom and ceiling members having plural deformable parts formed therein, spaced at a first pitch in the longitudinal direction, each deformable part separating and interconnecting corresponding, adjacent segments of the cooling fin and associated bottom and ceiling members, each deformable part being of a substantially smaller dimension in the longitudinal direction than the first pitch and having substantially less rigidity in the longitudinal direction than the segments of the cooling fins and associated bottom and ceiling members and permitting the heat sink structure to expand in the longitudinal direction by deformation of the deformable members producing relatively increased separation of the respective, adjacent segments of the cooling fins and associated bottom and ceiling members interconnected thereby; and each pair of adjacent cooling fins and the respective ceiling member defining a substantially completely surrounded airflow path in the longitudinal direction, directing airflow therethrough in the longitudinal direction and restricting any airflow in the lateral direction to a relatively insubstantial amount.

16. A heat sink structure as recited in claim 15, wherein corresponding deformable parts of the respective, plural cooling fins are aligned in the lateral direction and are defined by respective first U-shaped slots lying in a first common plane in the lateral direction and transverse to the longitudinal direction, extending through the bottom members and the respective, adjacent cooling fins upwardly to a position adjacent the respective ceiling members and by respective, second and third inverted U-shaped slots lying respectively in second and third common planes parallel to and spaced symmetrically with respect to the first common plane and extending through the ceiling members and through the cooling fins to positions adjacent the bottom members and thereby defining a U-shaped configuration of each deformable part when viewed in the lateral direction.

17. A heat sink structure as recited in claim 16, wherein the pitch of the deformable members is a multiple of the longitudinal dimension of each deformable part.

* * * * *

UNITED STATES PATENT AND TRADEMARK OFFICE
CERTIFICATE OF CORRECTION

PATENT NO.: 5,894,882
DATED : April 20, 1999
INVENTOR(S): Shunichi KIKUCHI et al.

It is certified that error appears in the above-identified patent and that said Letters Patent is hereby corrected as shown below:

Col. 1,     line 21, after "structure" insert --,--;
           line 27, after "sink" insert --,--;
           line 28, after "have" delete "a";
           line 37, delete "by air".

Col. 2,     line 2, change "," to --;--;
           line 3, after height" insert --,--;
           line 22, after "x-direction" insert --,--;
           line 41, after "40" insert --,--;
           line 43, delete --,--.

Col. 6,     line 16, change "flow" to --flows--;
           line 20, change "$7_{-2}$" to --$71_{-2}$--;
           line 29, change "$7_{-9}$" to --$71_{-9}$--;
           line 66, change "$70^{-1}$" to --$70_{-1}$--.

UNITED STATES PATENT AND TRADEMARK OFFICE
CERTIFICATE OF CORRECTION

PATENT NO.: 5,894,882
DATED : April 20, 1999
INVENTOR(S): Shunichi KIKUCHI et al.

It is certified that error appears in the above-identified patent and that said Letters Patent is hereby corrected as shown below:

Col. 7, line 5, change "$70_{1a}$" to -- $70-1a$ --.
line 19, change "with" to --to include--;
line 21, after "$P_2/2$" insert --,--;
line 49, after "passage" insert --,--;
line 50, after "$73_{-2}$" insert --,-- and after "escape" insert --to the--;

line 56, after "air" insert --flow--.

Col. 8, line 7, change "ends" to --each--;
line 56, after "shrink" insert --a--.

Col. 9, line 37, after "art" insert --,--;
line 44, after "93" insert --,--.

Signed and Sealed this

Fifteenth Day of February, 2000

Attest:

Attesting Officer

Q. TODD DICKINSON

Commissioner of Patents and Trademarks